(12) United States Patent
Hou et al.

(10) Patent No.: US 12,075,558 B2
(45) Date of Patent: Aug. 27, 2024

(54) PRINTED CIRCUIT BOARD

(71) Applicant: Huawei Digital Power Technologies Co., Ltd., Shenzhen (CN)

(72) Inventors: Zhaozheng Hou, Dongguan (CN); Xiaojing Liao, Shanghai (CN); Chao Shen, Shanghai (CN); Dongxing Wang, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 7 days.

(21) Appl. No.: 17/559,763

(22) Filed: Dec. 22, 2021

(65) Prior Publication Data

US 2022/0201837 A1    Jun. 23, 2022

(30) Foreign Application Priority Data

Dec. 23, 2020 (CN) .......................... 202011535522.3

(51) Int. Cl.
| | |
|---|---|
| *H05K 1/00* | (2006.01) |
| *H05K 1/02* | (2006.01) |
| *H05K 1/18* | (2006.01) |
| *H05K 7/20* | (2006.01) |

(52) U.S. Cl.
CPC ......... *H05K 1/0204* (2013.01); *H05K 1/0203* (2013.01); *H05K 1/0272* (2013.01); *H05K 1/182* (2013.01); *H05K 1/185* (2013.01); *H05K 7/20218* (2013.01)

(58) Field of Classification Search
CPC .. H05K 1/0204; H05K 1/0203; H05K 1/0272; H05K 1/182; H05K 1/185; H05K 7/20218; H05K 2201/064; H05K 2201/10416

USPC ........................................................ 361/699
See application file for complete search history.

(56) References Cited

U.S. PATENT DOCUMENTS

| | | | | |
|---|---|---|---|---|
| 3,431,350 | A | * | 3/1969 | Haberecht .............. H05K 1/114 439/70 |
| 5,763,951 | A | * | 6/1998 | Hamilton ............... H02K 99/00 257/E23.098 |
| 8,174,128 | B2 | | 5/2012 | Ikeguchi et al. |
| 2008/0144282 | A1 | | 6/2008 | Sugahara |
| 2012/0043127 | A1 | | 2/2012 | Lin et al. |

(Continued)

FOREIGN PATENT DOCUMENTS

| | | |
|---|---|---|
| CN | 2798312 Y | 7/2006 |
| CN | 101594739 A | 12/2009 |

(Continued)

*Primary Examiner* — Zhengfu J Feng
(74) *Attorney, Agent, or Firm* — Leydig, Voit & Mayer, Ltd.

(57) ABSTRACT

The present disclosure relates to the field of printed circuit board technologies. A printed circuit board with good heat dissipation performance is provided and includes a substrate serving as a board body of the printed circuit board, a heating component embedded in the substrate, and a cooling liquid channel disposed in the substrate. The cooling liquid channel is disposed in the printed circuit board, and passes around the heating component to exchange heat with the heating component, so that a heat dissipation path is shortened and heat dissipation efficiency is improved, thereby quickening heat dissipation of the printed circuit board, and prolonging a service life of the printed circuit board.

16 Claims, 4 Drawing Sheets

(56) References Cited

U.S. PATENT DOCUMENTS

| | | | |
|---|---|---|---|
| 2014/0362552 A1 | 12/2014 | Murayama et al. | |
| 2015/0163898 A1 | 6/2015 | Mokhtarzad | |
| 2019/0111862 A1* | 4/2019 | Dede | H05K 7/20636 |
| 2020/0137885 A1 | 4/2020 | Flowers et al. | |
| 2021/0337659 A1* | 10/2021 | Liu | H05K 1/0272 |
| 2022/0039252 A1* | 2/2022 | Zhou | H05K 1/185 |
| 2022/0053634 A1* | 2/2022 | Zhou | H05K 7/20336 |

FOREIGN PATENT DOCUMENTS

| | | |
|---|---|---|
| CN | 103928414 A | 7/2014 |
| CN | 105188260 A | 12/2015 |
| CN | 109417062 A | 3/2019 |
| CN | 212211498 U | 12/2020 |
| DE | 112009004714 B4 | 11/2018 |
| EP | 0331953 A1 | 9/1989 |
| JP | S6486543 A | 3/1989 |
| JP | 2001308470 A | 11/2001 |
| JP | 2008311397 A | 12/2008 |
| JP | 2009152284 A | 7/2009 |
| JP | 2019033226 A | 2/2019 |
| WO | 2009143682 A1 | 12/2009 |
| WO | 2011125344 A1 | 10/2011 |
| WO | 2015198893 A1 | 12/2015 |

* cited by examiner

PRINTED CIRCUIT BOARD

CROSS-REFERENCE TO RELATED APPLICATIONS

This application claims priority to Chinese Patent Application No. 202011535522.3, filed on Dec. 23, 2020, which is hereby incorporated by reference in its entirety.

TECHNICAL FIELD

The present disclosure relates to the field of printed circuit boards, and in particular, to a printed circuit board with good heat dissipation performance.

BACKGROUND

As electronic products are more small-sized and lightweight and have higher power, a heating component in a printed circuit board that uses embedded component packaging (ECP) is more integrated. When the printed circuit board works, the internal heating component generates a large amount of heat. If the heat cannot be efficiently dissipated from the heating component in the printed circuit board in time, a temperature of the heating component increases. Consequently, this affects working performance of the heating component, and even damages the heating component. Therefore, it is necessary to provide a printed circuit board that can effectively dissipate heat.

SUMMARY

In view of this, embodiments of this application provide a printed circuit board. A cooling liquid channel is disposed in the printed circuit board, cooling liquid flows in the cooling liquid channel, and the cooling liquid channel is enabled to pass around a heating component, so that the cooling liquid channel can be closer to the heating component, to shorten a heat dissipation path. Therefore, the cooling liquid effectively exchanges heat with the heating component to take away, in time, heat generated by the heating component, so as to improve heat dissipation efficiency, improve integration of the printed circuit board, and reduce a size of an electronic device including the printed circuit board.

A first aspect of the embodiments of the present disclosure provides a printed circuit board, including a substrate serving as a board body of the printed circuit board and a heating component embedded in the substrate.

A cooling liquid channel is disposed in the substrate, cooling liquid flows in the cooling liquid channel, and the cooling liquid channel passes around the heating component, so that the cooling liquid exchanges heat with the heating component.

The cooling liquid channel is embedded in the packaged printed circuit board, so that a heat dissipation path between the cooling liquid channel and the heating component is greatly shortened, and the cooling liquid more efficiently exchanges heat with the heating component to take away, in time, heat generated by the heating component, thereby improving heat dissipation efficiency. In addition, the cooling liquid channel is disposed in the printed circuit board, so that the printed circuit board can be more integrated, and a size of an electronic device including the printed circuit board can be reduced, thereby improving product competitiveness.

With reference to the first aspect, in a first possible implementation of the first aspect, the heating component includes pins, and the pins are embedded in the substrate; and one end of the pin is connected to the heating component, the other end of the pin is connected to a circuit cable on the substrate, and the circuit cable is configured to electrically connect the heating component to another component in the printed circuit board or a power supply.

The pins and the circuit cables are disposed, to implement an electrical connection between the heating component in the printed circuit board and another electronic component in the printed circuit board and/or the power supply, thereby helping the printed circuit board implement functions.

With reference to the first aspect or the first possible implementation of the first aspect, in a second possible implementation of the first aspect, the cooling liquid channel passes atop surface or a bottom surface of the heating component, so that the cooling liquid exchanges heat with the heating component by using the top surface or the bottom surface of the heating component.

Based on an actual heat dissipation situation of the heating component, the cooling liquid channel may pass only the top surface of the heating component, pass only the bottom surface of the heating component, or pass the top surface and the bottom surface of the heating component, and exchange heat with the heating component by using the top surface and/or the bottom surface that are/is of the heating component and that the cooling liquid channel passes. The cooling liquid channel is disposed based on a specific heating surface of the heating component, so that the cooling liquid can pertinently exchange heat with the heating surface of the heating component, thereby improving heat dissipation efficiency.

With reference to the second possible implementation of the first aspect, in a third possible implementation of the first aspect, the cooling liquid channel is in direct contact with the top surface or the bottom surface of the heating component, so that the cooling liquid directly exchanges heat with the top surface or the bottom surface of the heating component.

The cooling liquid channel is in direct contact with the top surface or the bottom surface of the heating component, so that a heat dissipation path can be effectively shortened, and efficiency of heat exchange between the cooling liquid and the heating component can be improved, thereby improving heat dissipation efficiency.

With reference to the second possible implementation of the first aspect, in a fourth possible implementation of the first aspect, copper foil is disposed on the top surface or the bottom surface of the heating component, one surface of the copper foil is in contact with the top surface or the bottom surface of the heating component, and the other surface of the copper foil is in contact with the cooling liquid channel, so that the cooling liquid exchanges heat with the top surface or the bottom surface of the heating component by using the copper foil.

The cooling liquid exchanges heat with the top surface or the bottom surface of the heating component by using the copper foil, so that the heat can be evenly dissipated, thereby improving heat dissipation efficiency. For example, when a heating point of the heating component is small, copper foil is disposed on a heating surface corresponding to the heating point, so that an area of contact between the heating point and the cooling liquid can be enlarged, thereby improving heat dissipation efficiency.

With reference to the first aspect or the first possible implementation of the first aspect, in a fifth possible implementation of the first aspect, the cooling liquid channel passes one or more side surfaces of the heating component, so that the cooling liquid exchanges heat with the heating component by using the one or more side surfaces of the heating component.

The cooling liquid channel may pass one or more side surfaces of the heating component based on an actual heat dissipation situation of the heating component, and exchange heat with the heating component by using the one or more side surfaces that are of the heating component and that the cooling liquid channel passes. The cooling liquid channel is disposed based on a specific heating surface of the heating component, so that the cooling liquid can pertinently exchange heat with the heating surface of the heating component, thereby improving heat dissipation efficiency.

With reference to the fifth possible implementation of the first aspect, in a sixth possible implementation of the first aspect, the cooling liquid channel is in direct contact with the one or more side surfaces of the heating component, so that the cooling liquid directly exchanges heat with the one or more side surfaces of the heating component.

The cooling liquid channel is in direct contact with the one or more side surfaces of the heating component, so that a heat dissipation path can be effectively shortened, and efficiency of heat exchange between the cooling liquid and the heating component can be improved, thereby improving heat dissipation efficiency.

With reference to the fifth possible implementation of the first aspect, in a seventh possible implementation of the first aspect, copper foil is disposed on the one or more side surfaces of the heating component, one surface of the copper foil is in contact with the one or more side surfaces of the heating component, and the other surface of the copper foil is in contact with the cooling liquid channel, so that the cooling liquid exchanges heat with the one or more side surfaces of the heating component by using the copper foil.

The cooling liquid exchanges heat with the one or more side surfaces of the heating component by using the copper foil, so that the heat can be evenly dissipated, thereby improving heat dissipation efficiency.

With reference to any one of the first aspect or the first to the seventh possible implementations of the first aspect, in an eighth possible implementation of the first aspect, one or more cooling liquid channels are disposed in the substrate based on a quantity of heating components or locations of the heating components.

When the quantity of heating components is excessively large and/or the heating components are laid out dispersedly, based on the layout of the heating components, one or more cooling liquid channels may be flexibly disposed, one cooling liquid channel may be separated into a plurality of cooling liquid channels in the printed circuit board, or a plurality of cooling liquid channels may be converged into one cooling liquid channel in the printed circuit board. The cooling liquid channel is flexibly disposed based on the quantity of heating components and/or the locations of the heating components, so that cooling liquid flowing paths in the printed circuit board can be reduced, thereby improving heat dissipation efficiency, and reducing a size of the printed circuit board.

With reference to any one of the first aspect or the first to the eighth possible implementations of the first aspect, in a ninth possible implementation of the first aspect, the printed circuit board further includes a cooling liquid outlet and a cooling liquid inlet, where the cooling liquid inlet is disposed on the top surface, the bottom surface, or the side surface of the printed circuit board; and the cooling liquid outlet is disposed on the top surface, the bottom surface, or the side surface of the printed circuit board.

The cooling liquid inlet disposed on the surface of the printed circuit board is connected to an outlet of a peripheral hydraulic pump, and the cooling liquid outlet is connected to an inlet of the peripheral hydraulic pump. The hydraulic pump provides pressure, so that the cooling liquid flows in the cooling liquid channel. The peripheral hydraulic pump is used, so that a size of the printed circuit board can be reduced.

With reference to any one of the first to ninth possible implementations of the first aspect, in a tenth possible implementation of the first aspect, one or more cooling liquid outlets and one or more cooling liquid inlets are disposed on the printed circuit board based on a quantity of cooling liquid channels and locations of the cooling liquid channels.

Locations and/or quantities of cooling liquid outlets and cooling liquid inlets are flexibly set based on the quantity of cooling liquid channels and the locations of the cooling liquid channels, so that cooling liquid flowing paths in the printed circuit board can be reduced, thereby improving heat dissipation efficiency, and reducing a size of the printed circuit board.

A second aspect of the embodiments of the present disclosure provides an electronic device, including the printed circuit board provided in the first aspect of the embodiments of the present disclosure, and an electronic component and a hydraulic pump that are installed on the printed circuit board. A liquid inlet of the hydraulic pump is connected to the cooling liquid outlet, and a liquid outlet of the hydraulic pump is connected to the cooling liquid inlet.

Various possible implementations of the electronic device provided in the second aspect of the embodiments of the present disclosure are the same as those of the first aspect, and all the foregoing beneficial effects can be achieved. To avoid repetition, details are not described herein again.

BRIEF DESCRIPTION OF DRAWINGS

To describe technical solutions in embodiments of the present disclosure more clearly, the following briefly describes the accompanying drawings used in describing the embodiments of the present disclosure.

DESCRIPTION OF EMBODIMENTS

The following describes the embodiments of this application with reference to the accompanying drawings in the embodiments of this application.

Figure 1:
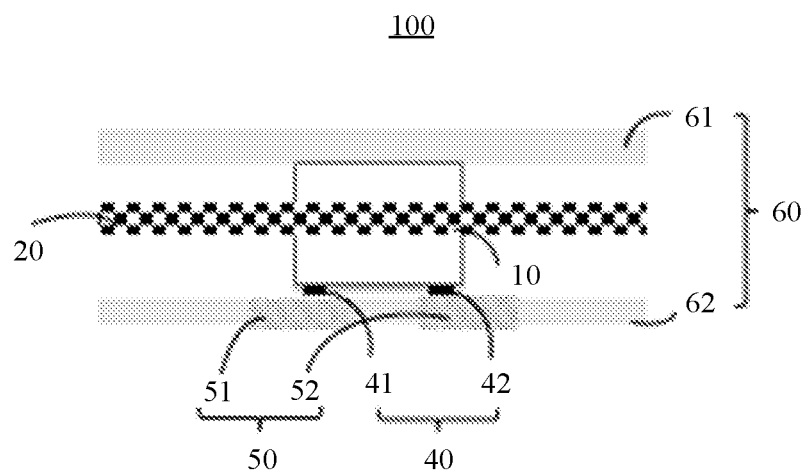
FIG. 1 is a schematic sectional view of a printed circuit board 100 according to an embodiment of the present disclosure.
Figure 2:
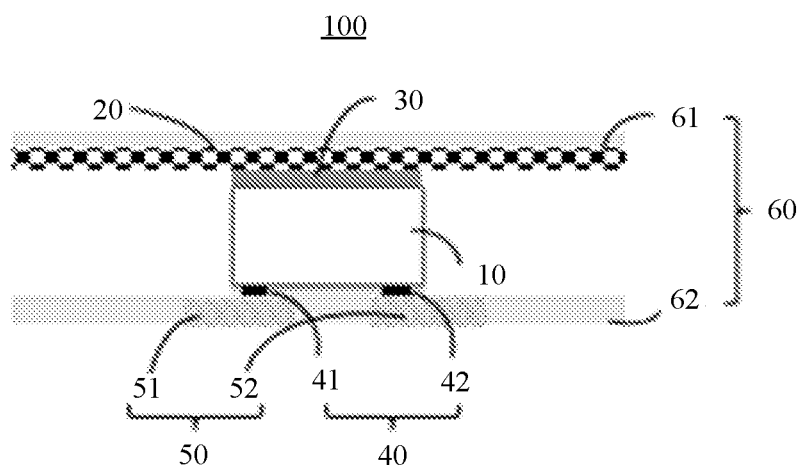
FIG. 2 is another schematic sectional view of a printed circuit board 100 according to an embodiment of the present disclosure.

Refer to FIG. 1 and FIG. 2. An embodiment of this application provides a printed circuit board 100, including a heating component 10 embedded in the printed circuit board 100, a cooling liquid channel 20, and substrates 60. Optionally, the printed circuit board 100 may further include a heat dissipation component 30, pins 40, and circuit cables 50 on the substrate. In FIG. 1 and FIG. 2, one heating component 10 is used as an example. However, the printed circuit board 100 may simultaneously include a plurality of heating components. In FIG. 1 and FIG. 2, that the heating component 10 has two pins (a left pin 41 and a right pin 42) is used as an example. However, the heating component may include another quantity of pins based on a specific design. There is a correspondence between the circuit cable and the pin. In FIG. 1 and FIG. 2, the circuit cables 50 include a circuit cable 51 connected to the pin 41 and a circuit cable 52 connected to the pin 42. The substrates 60 include a substrate 61 on a top surface of the heating component 10 and a substrate 62 on a bottom surface of the heating component 10.

Various electronic components (such as various types of chips, transformers, and rectifier circuits) may be disposed on the printed circuit board. Some functional components are heating components (such as a power switch tube, a power diode, an inductor, and a processor chip), and generate a large amount of heat in a working process of the printed circuit board, so that a heating point is formed at a location of the heating component in the printed circuit board. Because a temperature at the heating point is high, if the heat at the heating point is not dissipated in time, a lifespan of the printed circuit board is affected. In addition, a temperature of a substrate at the location corresponding to the heating point is also high, which causes local overheating of the substrate, and affects normal working of another device near the substrate. The problems resulting from the heating point are especially obvious in a printed circuit board of a high-power and small-sized power module. This restricts power improvement and miniaturization development of the power module. However, the printed circuit board provided in this embodiment of the present disclosure is used in a power module, and may be used in any electronic product.

According to the printed circuit board provided in this embodiment of this application, the cooling liquid channel is disposed in the printed circuit board, and is close to a location of the heating component, to shorten a heat dissipation path. When the printed circuit board works, the internal heating component produces heat to cause a temperature of the printed circuit board to rise while cooling liquid effectively exchanges heat with the heating component to take away, in time, heat generated by the heating component, thereby improving heat dissipation efficiency. In addition, the cooling liquid channel is embedded in the printed circuit board, so that the printed circuit board can be more integrated, and a size of an electronic device using the printed circuit board can be reduced.

In an implementation of this application, optionally, the electronic component may further include pins, and the pins are disposed on the substrate. One end of the pin is connected to the heating component, the other end of the pin is connected to the circuit cable on the substrate, and the pin is made of a conductive metal material. The heating component may be electrically connected to another heating component in the printed circuit board or a power supply by using the pins and the circuit cables on the substrate. A quantity of pins is not limited, for example, there may be two pins, or there may be three pins. A location, shape, and size of the pins may be set based on a requirement and a related design requirement.

In an implementation of this application, the cooling liquid channel may be in direct contact with the heating component, that is, the cooling liquid directly flows on a surface of the heating component, so that the cooling liquid can directly exchange heat with the heating component, to shorten a heat dissipation path, thereby improving heat dissipation efficiency. In another implementation, as shown in FIG. 1, the cooling liquid channel 20 may be connected to the heating component 10 by using the heat dissipation component 30, and the heat dissipation component may be a metal foil material, such as copper foil. A specific structure form of the heat dissipation component is not limited, provided that the heat dissipation component can evenly dissipate heat. When a heating point in the heating component is small, the heat dissipation component may be disposed to enlarge a heat dissipation area of the heating component, to improve efficiency of heat exchange between the heating component and the cooling liquid. A size of the heat dissipation component is not limited in this embodiment of the present disclosure. The heat dissipation component may have a cross-section with a same size as a cross-section of the top surface of the heating component. The cross-section of the heat dissipation component may be greater than or less than a cross-section of the heating component.

In an implementation of this application, optionally, a cooling liquid inlet and a cooling liquid outlet may be disposed on a surface of the printed circuit board, so that the cooling liquid can flow into the cooling liquid channel through the cooling liquid inlet, and flow out from the cooling liquid channel through the cooling liquid outlet. In addition, a hydraulic pump is disposed outside the printed circuit board, a liquid inlet of the hydraulic pump is connected to the outlet of the cooling liquid channel, and a liquid outlet of the hydraulic pump is connected to the inlet of the cooling liquid channel. The hydraulic pump provides pressure, so that the cooling liquid flows in the cooling liquid channel. When the cooling liquid inlet and the cooling liquid outlet are disposed on the surface of the printed circuit board, locations of the cooling liquid inlet and the cooling liquid outlet may be flexibly set based on a disposing manner of the cooling liquid channel. For example, one or more cooling liquid inlets and cooling liquid outlets may be disposed based on a quantity of cooling liquid channels and/or locations of the cooling liquid channels. The cooling liquid inlet may be disposed on a top surface, a bottom surface, or a side surface of the printed circuit board, and the cooling liquid outlet may also be disposed on the top surface, the bottom surface, or the side surface of the printed circuit board. The cooling liquid inlet and the cooling liquid outlet may be disposed on a same surface of the printed circuit board, or may be disposed on different surfaces of the printed circuit board.

In another implementation, the hydraulic pump of the cooling liquid may be disposed in the printed circuit board, the liquid inlet of the hydraulic pump is connected to the outlet of the cooling liquid channel, and the liquid outlet of the hydraulic pump is connected to the inlet of the cooling liquid channel. The hydraulic pump provides pressure, so that the cooling liquid flows in the cooling liquid channel. In this case, the hydraulic pump, the cooling liquid inlet, the cooling liquid outlet, and the cooling liquid channel are all integrated into the printed circuit board, and there is no need to dispose the cooling liquid inlet and the cooling liquid outlet on the surface of the printed circuit board.

In an implementation of this application, a layout of the cooling liquid channel may be flexibly designed based on a quantity of heating components and/or locations of the heating component, to minimize a heat dissipation path, thereby improve heat exchange efficiency. One or more cooling liquid channels may be disposed based on the quantity of heating components and/or locations of the heating components. Alternatively, based on a requirement, one cooling liquid channel may be separated into a plurality of cooling liquid channels in the printed circuit board, or a plurality of cooling liquid channels may be converged into one cooling liquid channel in the printed circuit board. Optionally, corresponding to the one or more cooling liquid channels, one or more cooling liquid inlets and cooling liquid outlets may also be disposed. A layout manner and a quantity of cooling liquid channels, and layout manners and quantities of cooling liquid inlets and cooling liquid outlets are not limited in this embodiment of the present disclosure. The cooling liquid channel is flexibly disposed, so that the cooling liquid channel can pass as more heating surfaces of the heating component as possible, thereby improving heat exchange efficiency.

In an implementation of this application, a size of the cooling liquid channel may be flexibly designed based on a size of the printed circuit board, and/or a size of the heating component, and/or a requirement on heat dissipation efficiency. The size of the cooling liquid channel is not limited in this embodiment of the present disclosure.

In an implementation of this application, the cooling liquid may be any liquid that can achieve a liquid cooling effect, and the cooling liquid may be a single substance, or may be a mixture of a plurality of substances. In one implementation, the cooling liquid may be conventional liquid, such as water. In another implementation, the cooling liquid may be some organic liquid, for example, acetone liquid and biphenyl liquid. Compared with normal water, the organic liquid can improve heat dissipation efficiency of a liquid-cooled heat dissipation apparatus. It should be understood that the foregoing descriptions are merely examples, and other cooling liquid components commonly in the art can alternatively be used.

In an implementation of this application, preferably, a boiling point of the cooling liquid is greater than or equal to 100° C. The cooling liquid has a high boiling point, so that adverse effects caused by boiling and vaporization of the cooling liquid can be effectively avoided, thereby improving safety performance of storage of the printed circuit board in a high-temperature environment, and improving safety performance of the printed circuit board in an extreme environment or in an abuse case. It can be understood that for a region with a high ambient temperature, a liquid with a high boiling point is selected as the cooling liquid as far as possible. However, for a region with a low ambient temperature, a liquid with a low boiling point may be selected as the cooling liquid. In an implementation of this application, preferably, a freezing point of the cooling liquid is less than or equal to 0° C. The cooling liquid has a low freezing point temperature, so that adverse effects caused by solidification of the cooling liquid can be effectively avoided, thereby improving storage of the printed circuit board in an extreme environment, and improving use effectiveness and safety of the printed circuit board. It can be understood that for a region with a low ambient temperature, a liquid with a relatively low freezing point that is uneasily to be frozen is selected as the cooling liquid as far as possible. However, for a region with a relatively high ambient temperature, a liquid with a relatively high freezing point may be selected as the cooling liquid.

In an implementation of this application, a specific heat capacity of the cooling liquid may be greater than 1 kJ/(kg·° C.). In some implementations, the specific heat capacity of the cooling liquid is greater than 2 kJ/(kg·° C.). In some implementations, the specific heat capacity of the cooling liquid is greater than 3 kJ/(kg·° C.). In some implementations, the specific heat capacity of the cooling liquid is greater than 4 kJ/(kg·° C.). The cooling liquid has a relatively large heat capacity, so as to better absorb heat and keep a temperature not to raise, thereby delaying a temperature raising time of the printed circuit board, and improving heat dissipation efficiency.

Figure 3:
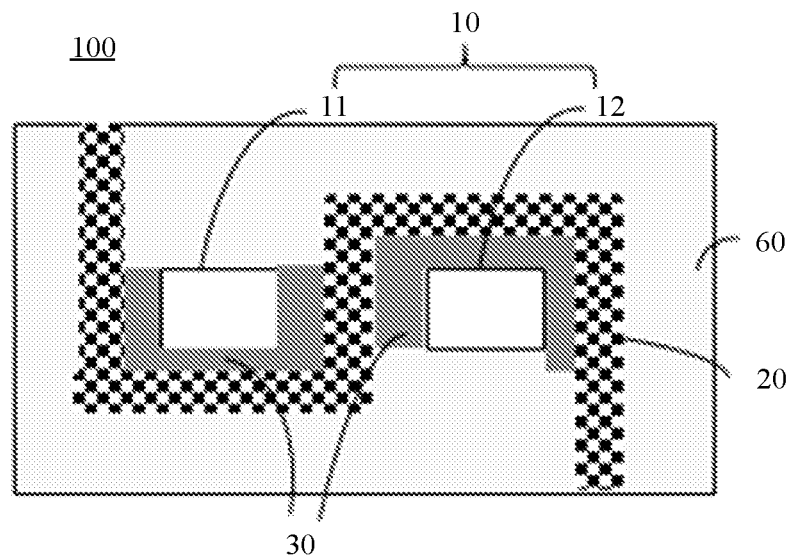
FIG. 3 is another schematic sectional view of a printed circuit board 100 according to an embodiment of the present disclosure.

Refer to FIG. 1. In an embodiment of the present disclosure, the cooling liquid channel 20 is disposed around a side surface of the heating component 10, that is, the cooling liquid channel 20 is disposed on a heating component layer in the printed circuit board, and is disposed around the side surface of the heating component. Refer to FIG. 3. To describe an arrangement manner of the cooling liquid channel more clearly, the following describes the arrangement manner of the cooling liquid channel by using two heating components as an example in FIG. 3. In FIG. 3, a heating component 31 and a heating component 32 are embedded in the printed circuit board. The cooling liquid channel 20 may be disposed around one or more side surfaces of each of the heating component 31 and the heating component 32 based on an actual heating condition of the heating component, to pertinently exchange heat with a heating surface of the heating component. For example, in the arrangement manner shown in FIG. 3, the cooling liquid channel may separately pass three heating surfaces of each of the heating component 31 and the heating component 32. It can be understood that a disposing manner of the cooling liquid channel is not limited to the disposing manner shown in FIG. 3, and other disposing manners that can meet a heat dissipation requirement are alternatively deployed. When a quantity of heating components is large and/or locations of the heating components are dispersed, a plurality of cooling liquid channels may be flexibly disposed based on the quantity of heating components and/or the locations of the heating components, thereby improving efficiency of heat exchange between the cooling liquid channel and the heating component.

Optionally, in an implementation, the cooling liquid channel may be in direct contact with one or more side surfaces of the heating component, so that the cooling liquid directly exchanges heat with the one or more side surfaces of the heating component, thereby improving heat dissipation efficiency. In another implementation, as shown in FIG. 3, the cooling liquid channel 20 may be in contact with one or more side surfaces of the heating component 10 by using the heat dissipation component 30 (copper foil or the like), so as to evenly dissipate heat.

Figure 4:
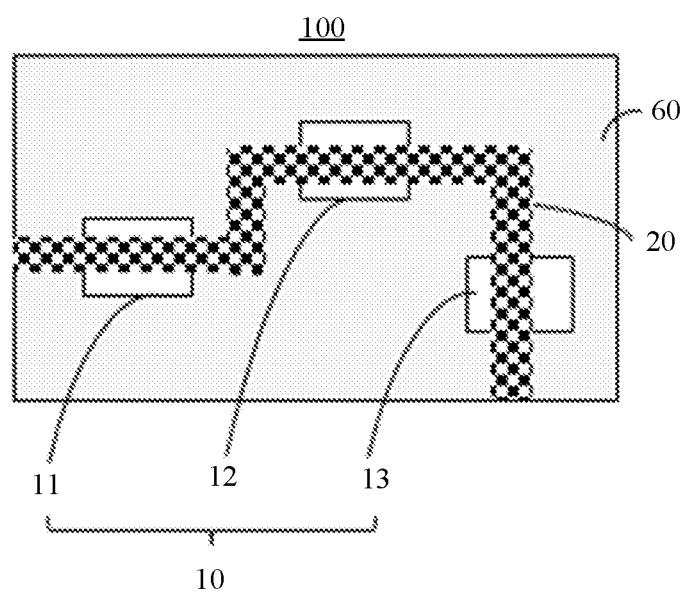
FIG. 4 is another schematic sectional view of a printed circuit board 100 according to an embodiment of the present disclosure.

Refer to FIG. 2. In an embodiment of the present disclosure, the cooling liquid channel 20 passes a top surface or a bottom surface of the heating component 10, that is, the cooling liquid channel 20 is disposed between the substrate 60 and the heating component 10. The cooling liquid channel 20 needs to be disposed separately from the pins 40 to avoid impact on use and safety of the printed circuit board. When the cooling liquid channel 20 is disposed on the top surface of the heating component 10, the pins 40 may be connected to the bottom surface of the heating component 10. Alternatively, when the cooling liquid channel 20 is disposed on the bottom surface of the heating component 10, the pins 40 may be connected to the top surface of the heating component 10. As shown in FIG. 4, three heating components are used as an example. A heating component 11, a heating component 12, and a heating component 13 are embedded in the printed circuit board. The cooling liquid channel 20 passes a top surface or a bottom surface of each of the heating component 11, the heating component 12, and the heating component 13, to exchange heat with the top surface or the bottom surface of the heating component. It can be understood that a disposing manner of the cooling liquid channel is not limited to the disposing manner shown in FIG. 4, and other disposing manners that can meet a heat dissipation requirement are alternatively deployed. When a quantity of heating components is large and/or locations of the heating components are dispersed, a plurality of cooling liquid channels may be flexibly disposed based on the quantity of heating components and/or the locations of the heating components, thereby improving efficiency of heat exchange between the cooling liquid channel and the heating component.

Optionally, in an implementation, the cooling liquid channel may be in direct contact with a top surface or a bottom surface of the heating component, so that the cooling liquid directly exchanges heat with the top surface or the bottom surface of the heating component, thereby improving heat dissipation efficiency. In another implementation, the cooling liquid channel may be in contact with a top surface or a bottom surface of the heating component by using the heat dissipation component (copper foil or the like), so as to evenly dissipate heat.

In an implementation of this application, the cooling liquid channel may be flexibly disposed based on different heating surfaces of the heating component, so as to improve heat dissipation efficiency. For example, the cooling liquid channel may pass a heating surface of each of different electronic components, or may pass a plurality of heating surfaces of one electronic component. The cooling liquid channel may pass only the top surface, the bottom surface, or the side surface of the heating component; or may pass both the top surface and the bottom surface, both the top surface and the side surface, or both the bottom surface and the side surface of the heating component; or may pass all of the top surface, the bottom surface, and the side surface of the heating component. The cooling liquid channel can be flexibly disposed based on an actual heating condition of the heating component and heat dissipation requirement.

Figure 5:
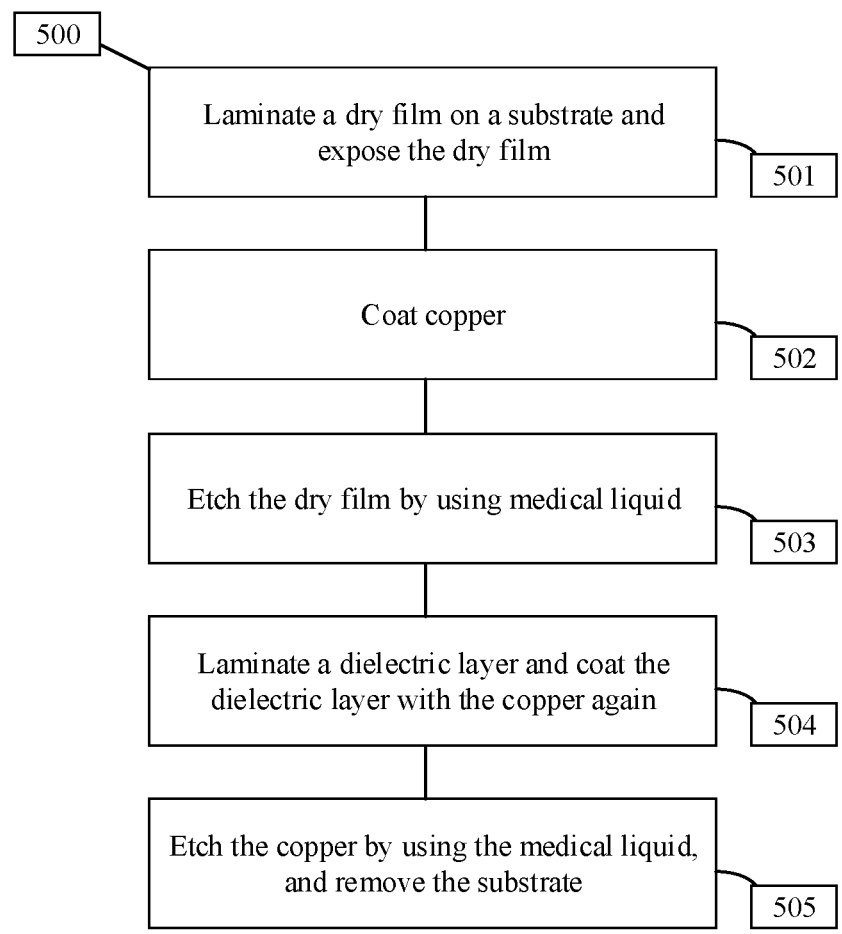
FIG. 5 shows a method for manufacturing a cooling liquid channel according to an embodiment of the present disclosure.
Figure 6:
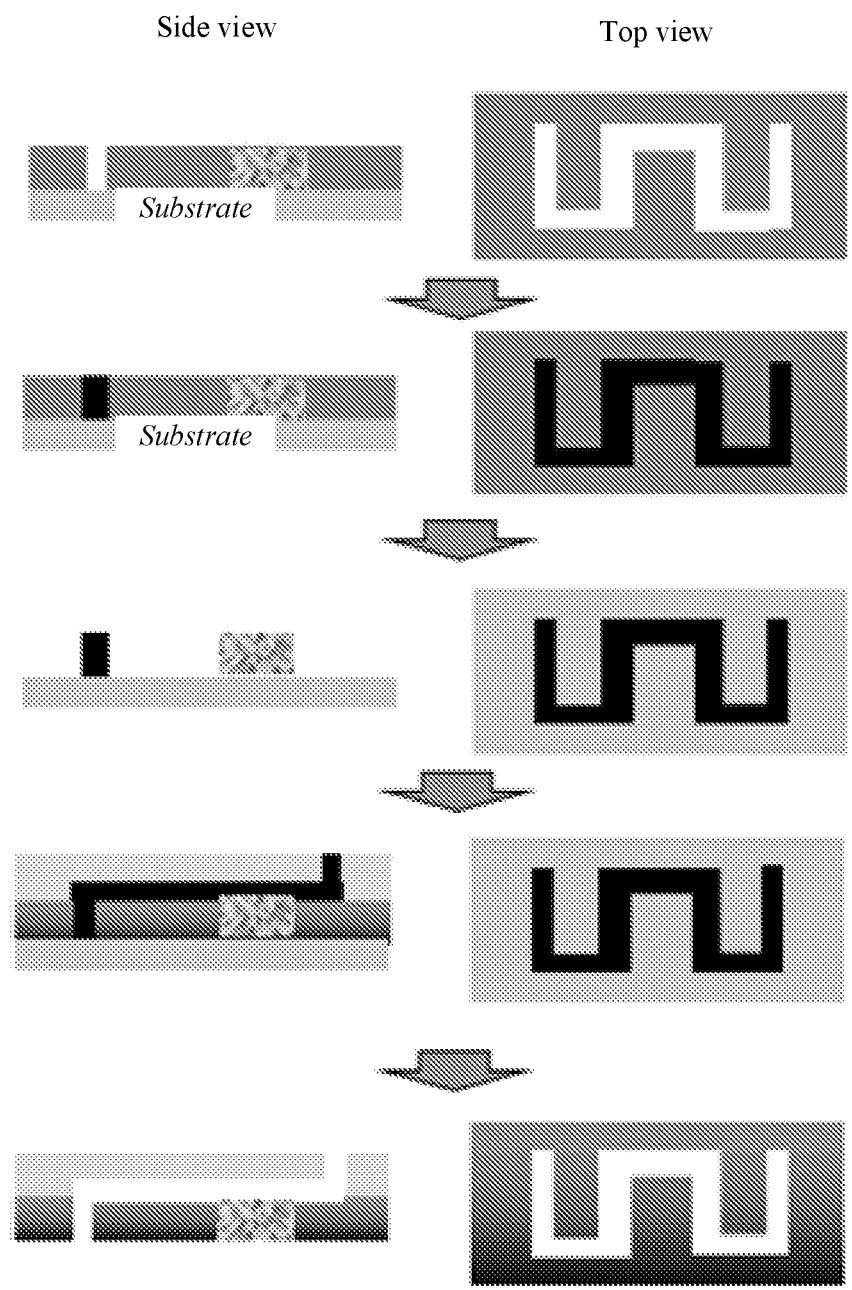
FIG. 6 is a schematic diagram of a method for manufacturing a cooling liquid channel according to an embodiment of the present disclosure.

Refer to FIG. 5. An embodiment of the present disclosure provides a method 500 for manufacturing a heat dissipation channel for cooling liquid, and a result of each step of the method is shown in FIG. 6. The method for manufacturing a heat dissipation channel for cooling liquid includes the following steps:

Step 501: Laminate a dry film on a substrate and expose the dry film.

In step 501, the dry film (a polymer material) is laminated on the substrate (a heating component is pre-attached to the substrate, and is a chip in this instance), and exposure and development are performed on the dry film to form a channel pattern.

Step 502: Coat copper.

After the channel pattern is formed in step 501, the channel pattern is completely coated with copper metal in step 502.

Step 503: Etch the dry film by using medical liquid.

In step 503, the dry film is etched by using the medical liquid.

Step 504: Laminate a dielectric layer and coat the dielectric layer with the copper.

In step 504, the dielectric layer (a polymer insulating material) is laminated, and is repeatedly coated with the copper to form paths on an upper layer and a lower layer.

Step 505: Etch the copper by using the medical liquid, and remove the substrate.

In step 505, the copper is etched by using the medical liquid to form a channel, and the substrate is removed.

In a process of manufacturing a printed circuit board, a cooling liquid channel is obtained through etching in the printed circuit board by using the etching process described in the method 500, so that the cooling liquid channel can be formed integrally with the printed circuit board, thereby reducing difficulties in implementing a process of embedding the cooling liquid channel in the printed circuit board. In addition, the etching process in the method 500 can be used to improve stability of the printed circuit board, thereby ensuring security of the printed circuit board during working and heat dissipation effect of the cooling liquid channel.

It should be understood that the method 500 is only a possible manner of manufacturing the printed circuit board provided in the embodiments of the present disclosure, and any other method can be used provided that the printed circuit board provided in the embodiments of the present disclosure can be manufactured and the foregoing beneficial effects can be achieved.

This application further provides an electronic device, including a printed circuit board, and an electronic component and a hydraulic pump that are installed on the printed circuit board. A liquid inlet of the hydraulic pump is connected to a cooling liquid outlet, and a liquid outlet of the hydraulic pump is connected to a cooling liquid inlet. In a possible implementation, the hydraulic pump may be packaged in the printed circuit board together with the cooling liquid channel. In another implementation, the hydraulic pump may be disposed outside the printed circuit board, and the cooling liquid inlet and the cooling liquid outlet are disposed on a surface of the printed circuit board to be connected to the hydraulic pump.

The electronic device provided in this embodiment of this application may be any electronic device that includes a printed circuit board, and may be a specific functional module such as a power module of an electronic device, or may be an electronic device such as a mobile phone, a tablet, a watch, or a camera that integrates a plurality of functional modules. A specific form of the electronic device is not limited herein. Other compositions of the electronic device in the embodiments of this application are well known to persons skilled in the art, and details are not described herein.

As the electronic device provided in the embodiments of this application includes the printed circuit board provided in the embodiments of this application, the electronic device and the printed circuit board can resolve same technical problems and achieve same expected effects.

Finally, it should be noted that the foregoing embodiments are merely intended to describe technical solutions of the present disclosure, but not for limiting the present disclosure. Although the present disclosure is described in detail with reference to the foregoing embodiments, persons of ordinary skill in the art should understand that the technical solutions described in the foregoing embodiments may still be modified, or some or all of the technical features thereof may be equivalently replaced. These modifications or replacements do not make the essence of the corresponding technical solutions depart from the scope of the technical solutions of the embodiments of the present disclosure.

What is claimed is:

1. A printed circuit board, comprising:
a substrate, wherein the substrate is a board body of the printed circuit board;
a heating component embedded in the substrate; and
a cooling liquid channel is disposed in the substrate, wherein cooling liquid flows in the cooling liquid channel, and the cooling liquid channel passes two or more surfaces of the heating component, so that the cooling liquid exchanges heat with the heating component;
wherein copper foil is disposed on the two or more surfaces of the heating component, one surface of the copper foil is in contact with the two or more surfaces of the heating component, and the other surface of the copper foil is in contact with the cooling liquid channel, so that the cooling liquid exchanges heat with the two or more surfaces of the heating component by using the copper foil.

2. The printed circuit board according to claim 1, wherein:
the heating component comprises a pin, and the pin is embedded in the substrate; and
one end of the pin is connected to the heating component, the other end of the pin is connected to a circuit cable on the substrate, and the circuit cable is configured to electrically connect the heating component to an electronic component in the printed circuit board or to a power supply.

3. The printed circuit board according to claim 1, wherein the cooling liquid channel passes a top surface or a bottom surface of the heating component, so that the cooling liquid exchanges heat with the heating component by using the top surface or the bottom surface of the heating component.

4. The printed circuit board according to claim 3, wherein the copper foil is disposed on the top surface or the bottom surface of the heating component, the one surface of the copper foil is in contact with the top surface or the bottom surface of the heating component, and the other surface of the copper foil is in contact with the cooling liquid channel, so that the cooling liquid exchanges heat with the top surface or the bottom surface of the heating component by using the copper foil.

5. The printed circuit board according to claim 1, wherein the cooling liquid channel passes one or more side surfaces among the two or more surfaces of the heating component, so that the cooling liquid exchanges heat with the one or more side surfaces of the heating component.

6. The printed circuit board according to claim 5, wherein the copper foil is disposed on the one or more side surfaces of the heating component, the one surface of the copper foil is in contact with the one or more side surfaces of the heating component, and the other surface of the copper foil is in contact with the cooling liquid channel, so that the cooling liquid exchanges heat with the one or more side surfaces of the heating component by using the copper foil.

7. The printed circuit board according to claim 1, wherein two or more heating components are embedded in the substrate, and wherein one or more additional cooling liquid channels are disposed in the substrate based on a quantity of the two or more heating components or locations of the two or more heating components.

8. The printed circuit board according to claim 1, further comprising:
a cooling liquid outlet; and
a cooling liquid inlet,
wherein the cooling liquid inlet is disposed on a top surface, a bottom surface, or a side surface of the printed circuit board; and
wherein the cooling liquid outlet is disposed on the top surface, the bottom surface, or the side surface of the printed circuit board.

9. The printed circuit board according to claim 7, wherein two or more cooling liquid outlets and two or more cooling liquid inlets are disposed on the printed circuit board based on a quantity of the cooling liquid channels disposed in the substrate and locations of the cooling liquid channels.

10. An electronic device, comprising:
a printed circuit board comprising a substrate and a heating component embedded in the substrate, wherein the substrate is a board body of the printed circuit board, wherein a cooling liquid channel is disposed in the substrate, wherein cooling liquid flows in the cooling liquid channel, and wherein the cooling liquid channel passes two or more surfaces of the heating component, so that the cooling liquid exchanges heat with the heating component; and
an electronic component and a hydraulic pump that are installed on the printed circuit board, wherein a liquid inlet of the hydraulic pump is connected to a cooling liquid outlet of the cooling liquid channel, and a liquid outlet of the hydraulic pump is connected to a cooling liquid inlet of the cooling liquid channel;
wherein copper foil is disposed on the two or more surfaces of the heating component, one surface of the copper foil is in contact with the two or more surfaces of the heating component, and the other surface of the copper foil is in contact with the cooling liquid channel, so that the cooling liquid exchanges heat with the two or more surfaces of the heating component by using the copper foil.

11. The electronic device according to claim 10, wherein:
the heating component comprises a pin, and the pin is embedded in the substrate; and
one end of the pin is connected to the heating component, the other end of the pin is connected to a circuit cable on the substrate, and the circuit cable is configured to electrically connect the heating component to another electronic component in the printed circuit board or to a power supply.

12. The electronic device according to claim 10, wherein the cooling liquid channel passes a top surface or a bottom surface of the heating component, so that the cooling liquid exchanges heat with the heating component by using the top surface or the bottom surface of the heating component.

13. The electronic device according to claim 12, wherein the copper foil is disposed on the top surface or the bottom surface of the heating component, the one surface of the copper foil is in contact with the top surface or the bottom surface of the heating component, and the other surface of the copper foil is in contact with the cooling liquid channel, so that the cooling liquid exchanges heat with the top surface or the bottom surface of the heating component by using the copper foil.

14. The electronic device according to claim 10, wherein the cooling liquid channel passes one or more side surfaces among the two or more surfaces of the heating component, so that the cooling liquid exchanges heat with the one or more side surfaces of the heating component.

15. The electronic device according to claim 14, wherein the copper foil is disposed on the one or more side surfaces of the heating component, the one surface of the copper foil is in contact with the one or more side surfaces of the heating component, and the other surface of the copper foil is in contact with the cooling liquid channel, so that the cooling liquid exchanges heat with the one or more side surfaces of the heating component by using the copper foil.

16. The electronic device according to claim 10, wherein two or more heating components are embedded in the substrate, and wherein one or more additional cooling liquid channels are disposed in the substrate based on a quantity of the two or more heating components or locations of the two or more heating components.

* * * * *